(12) United States Patent
Hicks et al.

(10) Patent No.: US 12,216,158 B2
(45) Date of Patent: Feb. 4, 2025

(54) CONTACTLESS OPTICAL PROBING OF EDGE-COUPLED PHOTONIC ICs

(71) Applicant: Intel Corporation, Santa Clara, CA (US)

(72) Inventors: Jeremy Hicks, Santa Clara, CA (US); Hari Mahalingam, San Jose, CA (US); Christopher Seibert, Santa Clara, CA (US); Eric Snow, Berkeley, CA (US); Harel Frish, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 817 days.

(21) Appl. No.: 17/102,891

(22) Filed: Nov. 24, 2020

(65) Prior Publication Data

US 2022/0163583 A1 May 26, 2022

(51) Int. Cl.
*G01R 31/311* (2006.01)
*G02B 6/30* (2006.01)
*G02B 6/42* (2006.01)

(52) U.S. Cl.
CPC .......... *G01R 31/311* (2013.01); *G02B 6/4214* (2013.01)

(58) Field of Classification Search
CPC ..... G02B 6/12004; G02B 6/30; G02B 6/4214
See application file for complete search history.

(56) References Cited

U.S. PATENT DOCUMENTS

| | | | |
|---|---|---|---|
| 5,978,531 A | 11/1999 | Funabashi | |
| 6,909,830 B2 | 6/2005 | Lee et al. | |
| 9,182,544 B2 * | 11/2015 | Kobrinsky | G02B 6/4245 |
| 2014/0252411 A1 * | 9/2014 | Kang | G02B 6/122 |
| | | | 438/69 |
| 2015/0097289 A1 * | 4/2015 | Zhang | H01L 23/522 |
| | | | 438/653 |
| 2015/0214122 A1 * | 7/2015 | Vermeulen | G01M 11/30 |
| | | | 438/14 |

(Continued)

FOREIGN PATENT DOCUMENTS

| | | |
|---|---|---|
| EP | 0940699 | 9/1999 |
| JP | H08181388 | 7/1996 |

OTHER PUBLICATIONS

Extended European Search Report for European Patent Application No. 21198771.4, dated Feb. 25, 2022.

*Primary Examiner* — Jermele M Hollington
*Assistant Examiner* — Temilade S Rhodes-Vivour
(74) *Attorney, Agent, or Firm* — Essential Patents Group, LLP

(57) ABSTRACT

Systems and methods for testing a photonic IC (PIC) with an optical probe having an out-of-plane edge coupler to convey test signals between the out-of-plane probe and an edge coupled photonic waveguide within a plane of the PIC. To accommodate dimensions of the optical probe, a test trench may be fabricated in the PIC near an edge coupler of the waveguide. The optical probe may be displaced along one or more axes relative to a prober to position a free end of the prober within the test trench and to align the probe's out-of-plane edge coupler with an edge coupler of a PIC waveguide. Accordingly, a PIC may be probed at the wafer-level, without first dicing a wafer into PIC chips or bars. The optical probe may be physically coupled to a prober through a contact sensor to detect and/or avoid physical contact between probe and PIC.

20 Claims, 12 Drawing Sheets

(56) References Cited

U.S. PATENT DOCUMENTS

2016/0131838 A1* 5/2016 Zhang .................... G02B 6/122
                                                                          438/31
2017/0254954 A1* 9/2017 Liu .......................... G02B 6/30
2020/0132947 A1   4/2020 Ho et al.
2020/0363588 A1 11/2020 Brusberg

* cited by examiner

CONTACTLESS OPTICAL PROBING OF EDGE-COUPLED PHOTONIC ICs

BACKGROUND

A photonic integrated circuit (PIC) includes integrated photonic devices or elements and may further include electrical devices or elements. PICs are preferred to optical systems built with discrete optical components and/or optical fiber because of the more compact size, lower cost, heightened functionality, and performance of PICs. Silicon Photonics (SiPh) technology continues to gain market share because of clear advantages in terms of manufacturability and scalability.

PICs have many applications, including optical data links in site-to-site optical communications and high performance computing, for example. In mobile computing platforms too, PICs offer a promising I/O for rapidly updating or syncing a mobile device with a host device and/or cloud service. PICs utilize an optical I/O interface that includes an optical transmitter and/or an optical receiver coupled to one or more photonic waveguides that propagate light within the PIC. PIC waveguides have minimum dimensions typically on the order a few micrometers (microns), and may terminate with a fiber-to-chip interface suitable for coupling the PIC waveguides to optical fibers having diameters on the order of a hundred microns.

As for the integrated circuit industry in general, PIC devices are advantageously fabricated in parallel on a large substrate, such as a 300 mm wafer. After fabrication, the PICs may be sorted based on an electrical test (E-test) and/or electro-optical test (EO-test). Individual PICs are singulated into chips, for example following a backside wafer grind. Singulated die identified as good may then be assembled into a package and a final functional test of the packaged PIC performed. As post-singulation testing and package assembly practices continue to become more complex, it is increasingly important to perform a comprehensive EO-test on unpackaged PIC die, preferably at the wafer-level.

To perform an electrical test at the wafer-level, a prober head of a testing apparatus (tester) may be coupled to a PIC device under test (DUT) through a plurality of electrical probes. Wafer-level optical testing of a PIC DUT poses more of a challenge because the fiber-to-chip interface of the PIC is not yet present (typically being added at the package-level). According to some conventions, optical testing is done with an optical probe that is suspended above (e.g., ~1 mm) the DUT wafer surface. With such a system, an on-chip mirror is relied upon to convey light to/from a PIC. On-chip mirrors patterned on wafers can cause detrimental reflections into the wafer, for example that may de-stabilize on-chip light sources. Some mirrors may also add undesirable polarization dependence. Such reflections and/or polarizations can reduce optical test data quality. Vertically oriented on-chip mirror structures are also incompatible with PIC-to-fiber interface designs that utilize an on-chip optical edge coupler. While such edge coupled PIC-to-fiber interface designs have many advantages, the convention for testing edge coupled PICs is to first dice a wafer into bars (e.g., including multiple PICs), which provides free access to the edge coupler of a PIC. Conventional "bar" testing methods are therefore incapable of directly measuring light emitted from un-diced wafers, and, because bar handling and testing is less automated, optical testing of a diced wafer is expensive.

Accordingly, any testing apparatus, testing technique, and associated on-chip test structure(s) suitable for wafer-level optical testing of edge coupled PICs offer commercial advantages.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
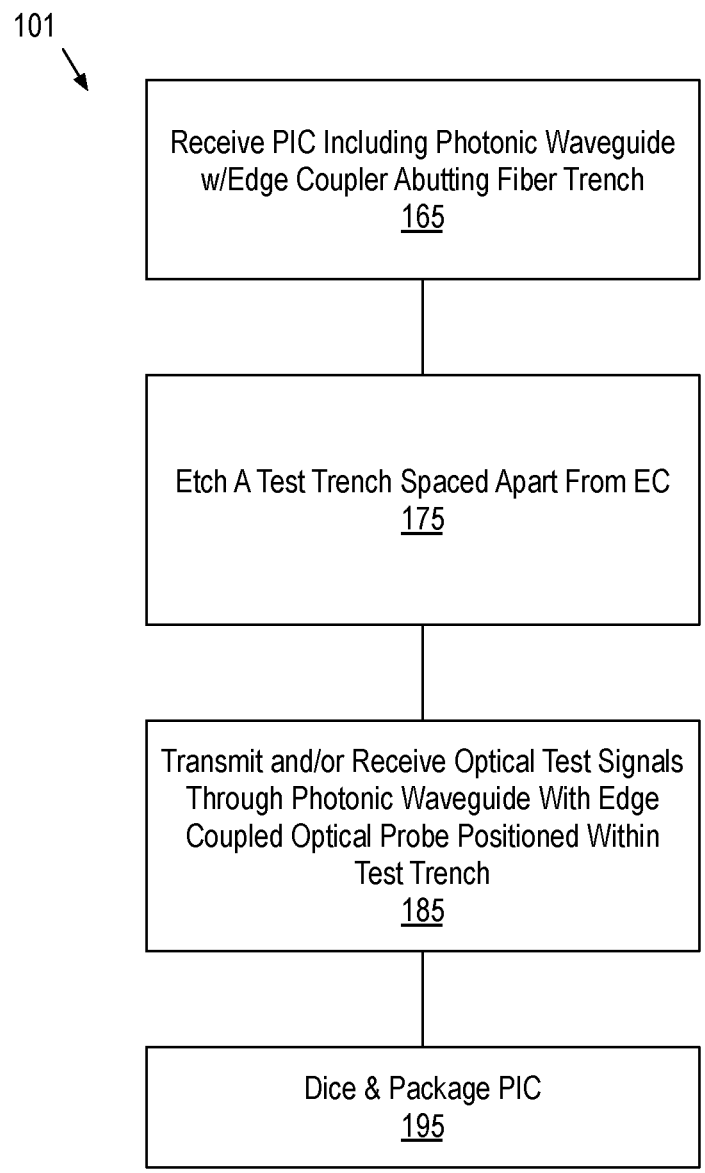
FIG. 1 is a flow diagram illustrating methods of contactless optical probing of an edge coupled photonic integrated circuit (PIC) device under test (DUT), in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of or "one or more of" can mean any combination of the listed terms. For example, the phrase "at least one of" A, B or C" can mean A; B; C; A and B; A and C; B and C; or A, B and C.

Described below are systems and methods for testing a photonic IC (PIC) with an optical probe having an out-of-plane edge coupler to convey test signals between the out-of-plane probe and an edge coupled photonic waveguide in the PIC. To accommodate dimensions of the optical probe, a test trench may be fabricated in the PIC near a waveguide edge coupler, for example of a PIC-fiber interface. The optical probe may be translated along one or more axes relative to a prober to position a free end of the prober within the test trench so that the probe's out-of-plane edge coupler is aligned with an edge coupler of a PIC waveguide. Accordingly, a PIC device under test (DUT) may be probed at the wafer-level, without first dicing a wafer into PIC chips or bars. The optical probe may be physically coupled to a prober through a contact force sensor to detect contact between the probe and a surface of a PIC. If contact is detected, the probe may be withdrawn to avoid damage to the probe and/or to a PIC DUT.

FIG. 1 is a flow diagram illustrating methods 101 for contactless optical probing of an edge coupled PIC DUT, in accordance with some embodiments. Methods 101 begin at block 165 where a PIC is received, for example from a PIC fabrication process performed upstream of methods 101. As received, the PIC includes a photonic waveguide with an edge coupler (EC). The waveguide EC may be part of a PIC-to-fiber interface, for example.

Methods 101 continue at block 175 where an optical test trench is etched into the PIC. The test trench may be etched with any etch process (e.g., reactive ion etch, Bosch etch, etc.) suitable for forming a trench into one or more materials of the PIC of sufficient dimensions (e.g., depth and width) to accommodate insertion of an optical probe oriented out of a plane of the PIC. The test trench is in sufficient proximity to the waveguide EC that optical modes supported by the waveguide are coupled into free space within the test trench. In some advantageous embodiments, the test trench is integrated into a waveguide-to-fiber interface of the PIC with the test trench intersecting, or crossing, one or more fiber trenches. Although formation of the test trench is illustrated as part of methods 101, the test trench may instead be fabricated upstream of methods 101 so that the test trench is present in the PIC received at block 165.

Methods 101 continue at block 185 where optical test signals are conveyed between automated electrical test equipment (ATE) and a PIC device under test (DUT) to ascertain DUT parametrics. Between the ATE and PIC DUT, optical signals are transmitted and/or received through an optical probe that has a free end positioned within the free space of the test trench. The out-of-plane edge coupler proximal to the free end of the optical probe emits and collects light within the plane of the PIC DUT (i.e., horizontally) to and from the waveguide edge coupler. Multiple PIC DUTs, for example of a same wafer, may be tested in succession, for example as a means of sorting the multiple PICs according to predetermined criteria that include optical parametrics determined from the optical test signals.

Methods 101 complete at block 195 where a wafer of PICs is diced into discrete PIC chips or die. Those PIC chips that satisfy some sort criteria may then be packaged according to any technique(s) suitable for the application. In some examples, a functional PIC (e.g., SiPh) chip is assembled with an optical fiber array, which includes an optical fiber that is coupled to the waveguide EC that was previously tested by the optical probe as described herein.

Figure 2A:
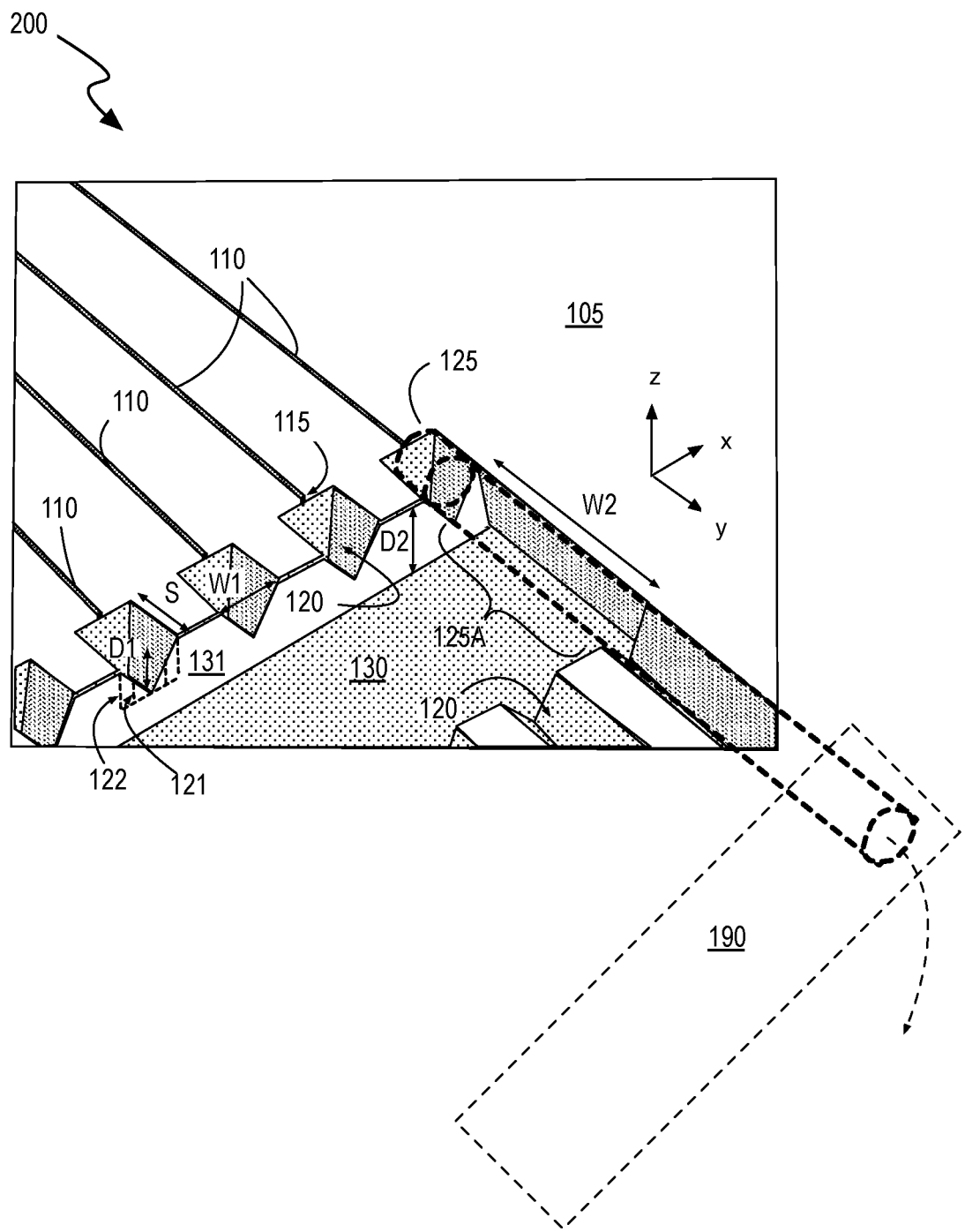
FIG. 2A is an isometric view of an optical test trench integrated into a photonic waveguide-fiber interface of a PIC, in accordance with some embodiments.

FIG. 2A is an isometric view of an optical test trench 130 integrated into a photonic waveguide-fiber interface of a PIC 200, in accordance with some embodiments. As shown, PIC 200 includes a plurality of substantially co-planar photonic waveguides 110. Each waveguide may have any composition and structure (e.g., rib, ridge, etc.) suitable for guiding optical modes within the PIC. In this example, waveguides 110 comprise predominantly silicon (e.g., single crystalline). Waveguides 110 are over a substrate material 105, such as, but not limited to, a dielectric material. For embodiments where waveguides 110 are silicon, substrate material 105 may be silicon dioxide, for example as material layers of an SOI substrate. Substrate material 105 may be over any number of other substrate materials, such as, but not limited to crystalline silicon of an SOI substrate.

A waveguide EC 115 is at a terminus of each of waveguides 110. Waveguide EC 115 may have any structure (e.g., inverse taper, sub-wavelength grating, etc.) suitable for coupling light between waveguide 110 and an optical fiber. In some exemplary embodiments, EC 115 comprises an end facet at the waveguide terminus.

As further illustrated in FIG. 2A, PIC 200 includes a plurality of fiber trenches 120. Each fiber trench 120 abuts an EC of a waveguide 110. Fiber trench 120 may have any dimensions suitable for accommodating an optical fiber oriented substantially co-linear (end-to-end) with waveguide 110 so that waveguide EC 115 will face an edge coupler (e.g., a planar polished end) of the optical fiber. Although no optical fibers are yet present within fiber trenches 120, a dashed outline demarks where a cladded fiber 125 will reside when assembled with PIC 200, for example by an epoxy bond at a fiber land 190 proximal to an opposite end of fiber trenches 120.

In some embodiments, EC 115 comprises an end facet that is anistropically etched as part of an etch process that forms fiber trenches 120. For example, a first (e.g., Si) RIE process may define the waveguide end facet, a second (e.g., $SiO_2$) RIE process may etch through substrate material 105, and a final (e.g., silicon) etch may etch into the underlying substrate material. In some embodiments, at least a portion of fiber trenches 120 have a v-groove profile, for example as a result of a crystallographic etch process that is selective to particular crystal planes. In the illustrated example, solid lines depict a self-terminated v-groove profile where slow etching facets intersect each other at the bottom of fiber trenches 120. As further illustrated in dashed lines, fiber trench profile 121 is sloped with a v-profile only at a top portion, with a non-grooved (e.g., flat) trench bottom. Another exemplary fiber trench profile 122 that is not v-grooved at all is further illustrated in dashed line 122. Hence, fiber trenches 120 may have a range of sidewall profiles. Fiber trenches 120 have a top width W1 and a depth D1 (as measured from a bottom surface of waveguides 110) that are sufficient to accept optical fiber 125. In some exemplary embodiments where fiber 125 is a single mode fiber (SMF), fiber trench width W1 and depth D1 are both less than 200 µm for embodiments where fiber 125 has a diameter of around 125 µm.

As shown in FIG. 2A, optical test trench 130 is aligned (e.g., along the x-dimension) with waveguide EC 115. Test trench 130 is spaced apart (e.g., in y-dimension) from waveguide EC 115 by a lateral distance S sufficient to preserve EC 115. Lateral distance S is advantageously no more than 500 µm, and may be 50-100 µm, or less in an effort to reduce optical signal losses to free space within fiber trenches 120. Test trench 130 intersects the plurality of fiber trenches 120, bifurcating them between the waveguide EC 115 and fiber land 190. When optical fibers are assembled to PIC 200, a fiber length 125A will span, or bridge, test trench 130. At that point, test trench 130 may be at least partially filled, for example with an epoxy or other underfill material. Alternatively, test trench 130 may be retained in a package PIC as a free-space recess, substantially as illustrated in FIG. 2A. In some embodiments, test trench 130 intersects all fiber trenches 120. Test trench 130 may however be so short (or misaligned) that it intersects as few as only one of fiber trenches 120. For alternative embodiments where there are no fiber trenches, test trench 130 may instead intersect waveguide(s) 110 with a sidewall of test trench 130 defining an end facet of waveguide EC 115.

Dimensions of test trench 130 may vary with implementation. Test trench width W2 is large enough to accommodate an optical probe without physical contact between the two. Test trench width W2 may therefore depend on both a diameter of the probe and positional control of the probe. For embodiments further described below where an optical probe has a diameter less than 100 µm, test trench width W2 is more than 200 µm, and advantageously at least 300 µm (e.g., 300-900 µm). For embodiments where there is only one waveguide EC, test trench 130 may have a substantially square footprint (e.g., W2×W2). For embodiments where there are multiple waveguides ECs, test trench 130 may have a rectangular footprint with any length sufficient to span all the waveguide ECs.

In some embodiments, at least one of test trench width W2 or test trench depth D2 is different than fiber trench width W1 or fiber trench depth D1, respectively. In the illustrated embodiments, test trench width W2 significantly exceeds fiber trench width W1. Test trench 130 has a depth D2, as measured from a bottom surface of waveguides 110. Trench depth D2 may also vary, for example as a function of optical probe control and probe design. As described further below, depth D2 is advantageously sufficient to allow an out-of-plane EC proximal to a free end of an optical probe to align with waveguide EC 115 without the free end of the probe coming into contact with the bottom of test trench 130. In the illustrated embodiments, test trench depth D2 is greater than the fiber trench depth D1. Trench depth D2 may also be less than 200 µm, and advantageously no more than 100 µm (e.g., 75-100 µm), in which case trench depth D2 may be less than trench depth D1.

Figure 2B:
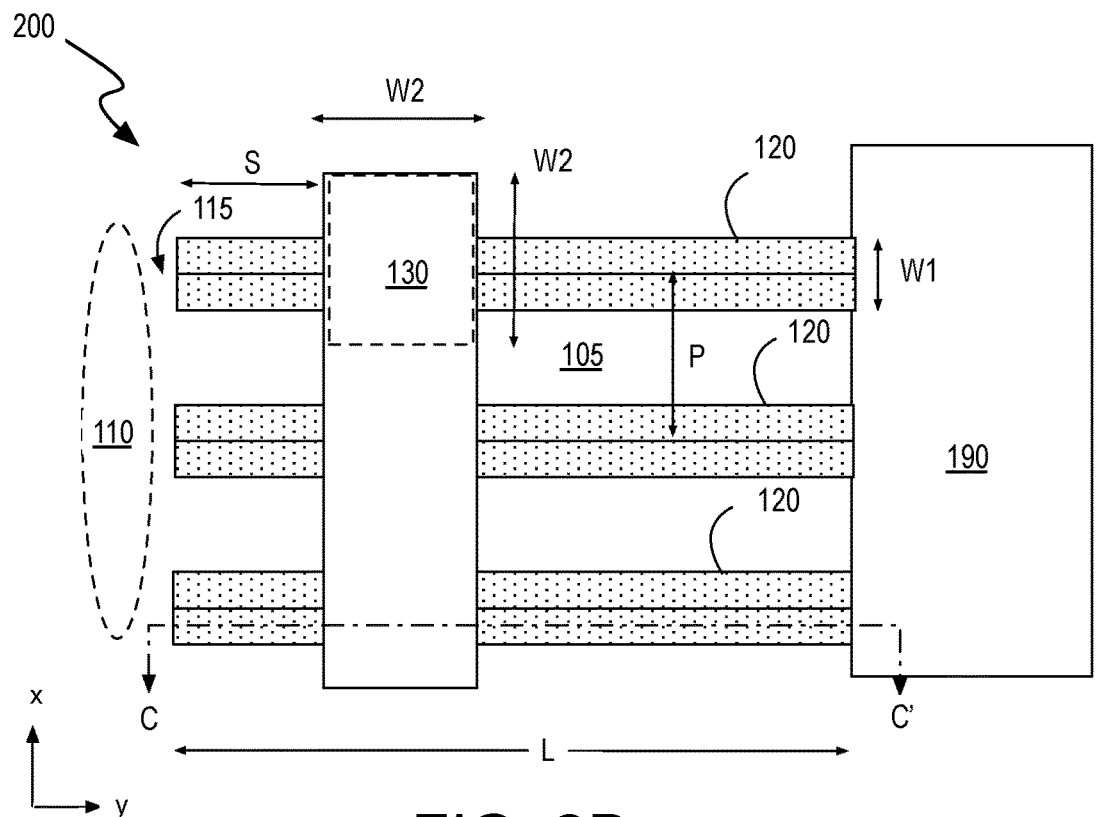
FIG. 2B is a plan view of an optical test trench integrated into a photonic waveguide-fiber interface of a PIC, in accordance with some embodiments.

FIG. 2B is a plan view of test trench 130 intersecting fiber trenches 130, in accordance with some embodiments. As shown, fiber trenches 120 have a pitch P, which may vary with implementation. In some examples where fiber trench width W1 is less than 100 µm, fiber trench pitch P is no more than 250 µm. Fiber trenches 120 have a longitudinal length L between EC 115 and fiber land 190. Trench length L may vary, but in some embodiments is 2-5 times larger than test trench width W2. As further illustrated in days line, test trench 130 may be substantially square of width W2 if only one waveguide is to be optically probed.

Figure 2C:
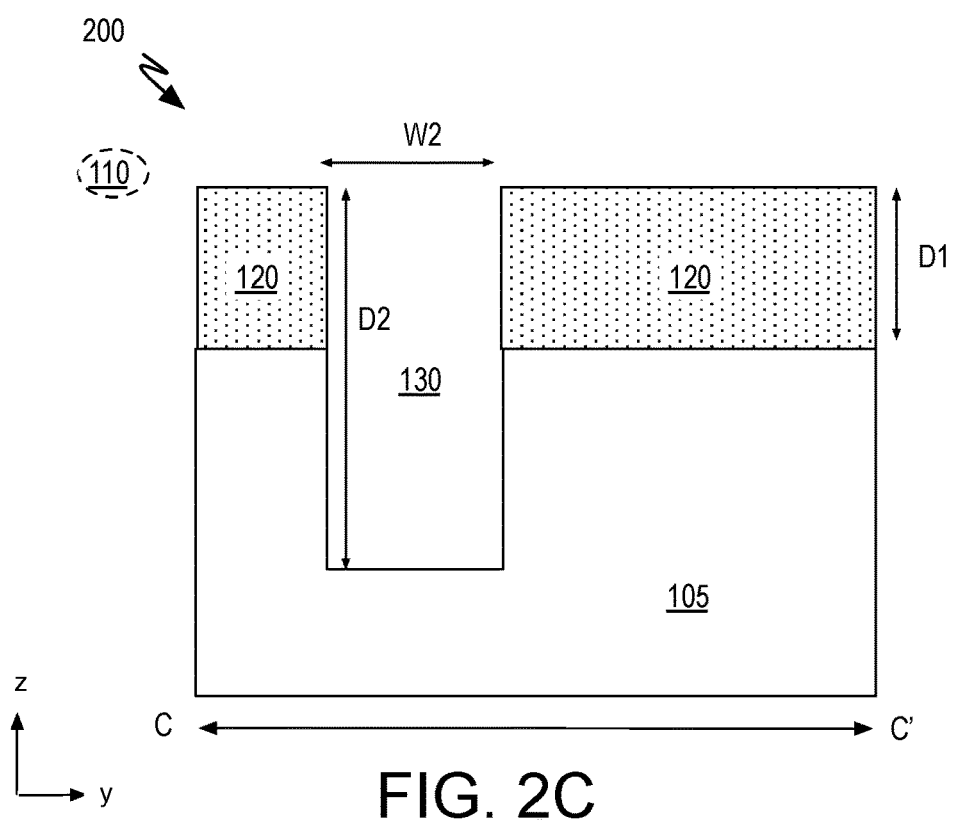
FIG. 2C is a cross-sectional view of an optical test trench integrated into a photonic waveguide-fiber interface of a PIC, in accordance with some embodiments.

FIG. 2C is a cross-sectional view of test trench 130 along the C-C' line denoted in FIG. 2B, in accordance with some embodiments. Although the profile of test trench 130 may vary, in some embodiments test trench 130 has a flatter bottom profile than fiber trenches 120. Hence, even if fiber and test trench depths D1 and D2 are approximately equal, test trench 130 has a flatter bottom profile as the v-groove bottom profile of fiber trench 130 would disadvantageously reduce the trench area available to accommodate an optical probe for a given trench depth. Any differences between trench depths D1 and D2, as well as differences in trench profiles (e.g., v-groove vs. flat), is indicative of test trench 130 having been fabricated separately from fiber trenches 120. In some examples, test trench 130 is formed with a highly anisotropic, deep RIE process (e.g., Bosch-type etch process, TSV-type etch process, etc.). Although test trench 130 is illustrated with a substantially vertical sidewall, a test trench sidewall may instead be undercut (concave) or sloped/tapered.

Figure 3:
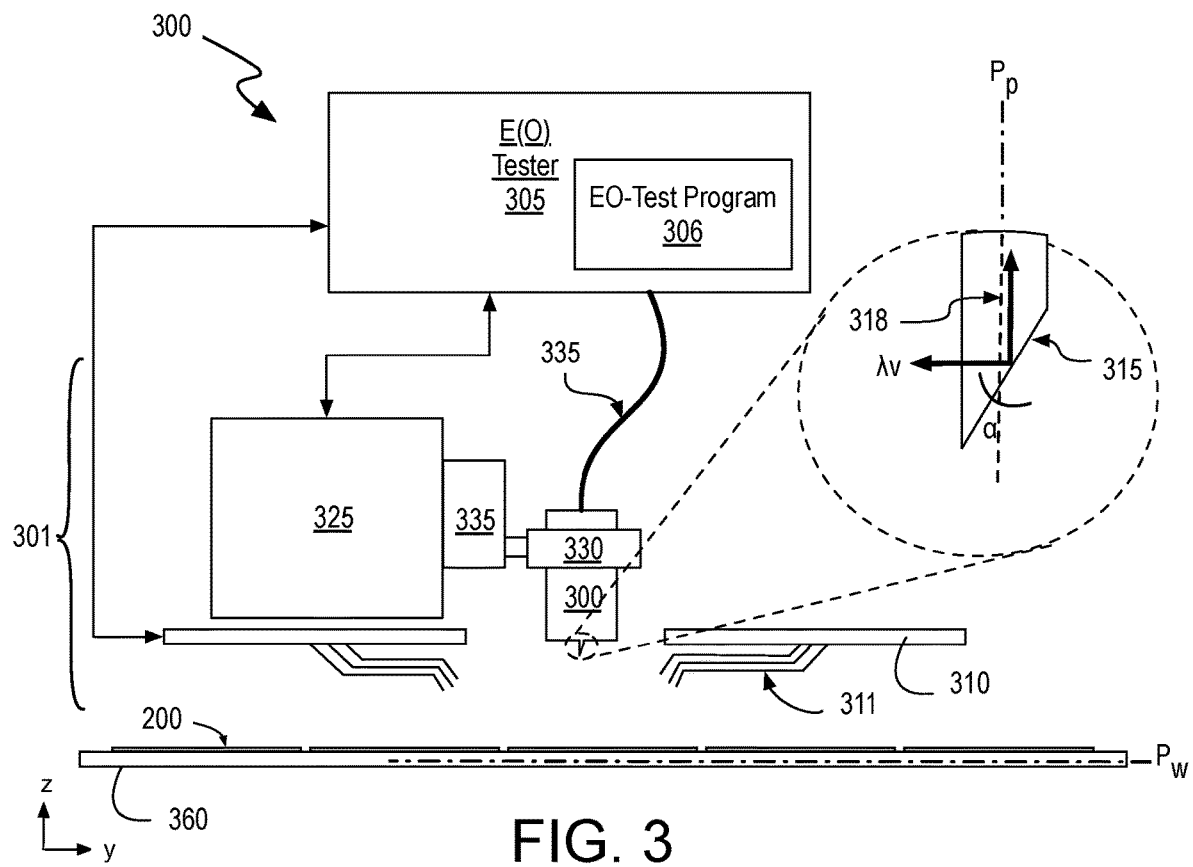
FIG. 3 is a schematic of a testing system for contactless probing of edge coupled PIC DUTs, in accordance with some embodiments.

FIG. 3 is a schematic of a testing system 300 for contactless probing of edge coupled PICs 200, in accordance with some advantageous embodiments where PIC 200 is a portion of a contiguous wafer 360. Testing system 300 includes a tester 305 that generates electrical test signals according to instructions stored in memory as a test program 305, and collects electrical test signals indicative of the PIC DUT. Tester 305 may further generate optical test signals and collect optical test result signals as an (electro) optical tester. Tester 305 is communicatively coupled to a prober 301.

Prober 301 includes a probe card 310 to which electrical probes 311 are attached. Prober 301 further includes a motorized multi-axis (e.g., with 3-6 DOF) optical probe stage 325. A base of an optical probe 300 is mechanically coupled to probe stage 325 through any suitable holder 330, and, optionally, through a probe contact sensor 335. Optical probe 300 is therefore moveable relative to wafer 360 as part of prober 301, which can traverse a plane substantially parallel to wafer plane $P_w$, for example to align electrical probes 311 with electrical test points on PIC 200. In the exemplary embodiment, motorized probe stage 325 is mechanically affixed to prober 301 such that optical probe 300 is further moveable relative to probe card 310 along any of the available probe stage axes.

In the illustrated embodiments, probe 300 is physically coupled to probe stage 325 through probe contact sensor 335. Probe contact sensor 300 may be a force detector/ transducer suitable for the application. In some embodiments, probe contact sensor 300 comprises a mechanical-electrical transducer that converts strain energy into an electrical system, such as, but not limited to, a piezoelectric device. In other embodiments, probe contact sensor 300 comprises an optical system, such as, but not limited to, a depth camera, or a light detection and (ranging LIDAR) system.

Optical probe 300 is communicatively coupled to tester 305 through one or more optical fibers 335 (e.g., a fiber array). A free end, or tip, of optical probe 300 is further shown in an expanded view of FIG. 3. As shown, optical probe 300 extends down toward waveguide (wafer) plane $P_w$. Optical probe 300 has an optical axis 318 that is within probe plane $P_p$. Probe plane $P_p$ is out of waveguide plane $P_w$, and is advantageously substantially perpendicular to waveguide plane $P_w$. Optical probe 300 may be of any material suitable for optical components, as embodiments herein are not limited in this respect. In some examples, optical probe 300 comprises an acrylic, or a siloxane (e.g., poly(dimethylsiloxane).

With optical axis 318 being out of waveguide plane $P_w$, probe 300 includes an out-of-plane edge coupler that redirects light λv between waveguide plane $P_w$ and probe plane $P_p$, and so optical testing may be performed without dicing a wafer and with automated test equipment configured for top-down access to test points on an IC. In the example shown in the expand view of FIG. 3, the out-of-plane edge coupler is an angled surface 315. With the refractive index contrast between the probe material and free-space, angled surface 315 functions as an optical mirror. Angled surface 315 may have any angle α relative to probe plane $P_p$ (e.g., 30-60°).

Figure 4A:
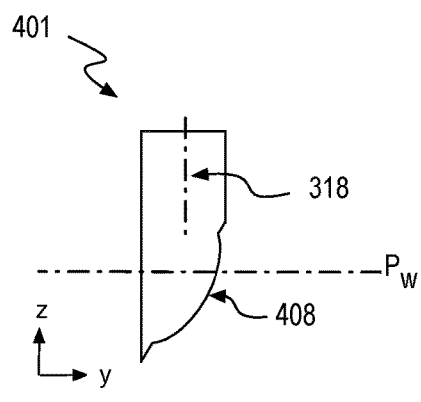
FIG. 4A is a cross-sectional view of an optical probe for out-of-plane edge coupling, in accordance with some alternative embodiments.

FIG. 4A is a cross-sectional view of an optical probe 401 for out-of-plane edge coupling, in accordance with some alternative embodiments. Optical probe 401 illustrates an example where the out-of-plane edge coupler comprises a curved mirror surface 408, instead of the planar angled surface 315 of probe 300. Curved mirror 408 in this example has convex surface curvature and may have any radius. Light propagating over a range of angles near parallel to wafer plane $P_w$ will therefore be reflected by the interior reflective (concave) surface to propagate substantially along the out-of-plane probe axis 318. Optical probe 401 may have any composition with suitable refractive index, such as, but not limited to, an acrylic, or a siloxane.

Figure 4B:
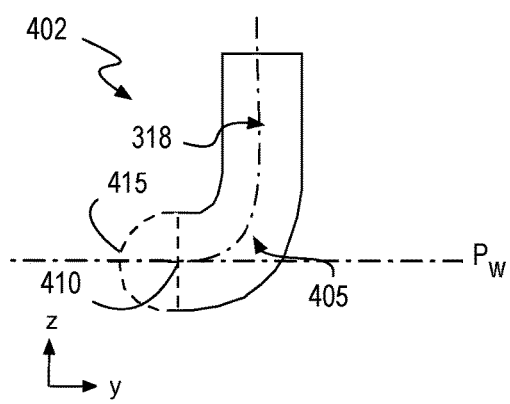
FIG. 4B is a cross-sectional view of an optical probe for out-of-plane edge coupling, in accordance with some alternative embodiments.

FIG. 4B is a cross-sectional view of an optical probe 400 for out-of-plane edge coupling, in accordance with some alternative embodiments. Optical probe 402 illustrates an example where the out-of-plane edge coupler comprises a bend 405, which renders a planar free end face 410 substantially perpendicular to waveguide plane $P_w$. Free end face 410 is therefore substantially parallel to an end facet, or otherwise oriented relative to an end coupler of a photonic waveguide to receive/transmit light from/to a PIC. Bend 405 may have any radius such that lateral dimensions (e.g., y-dimension) of probe 400 are compatible with dimensions of a test trench without incurring excessive bend losses. A larger bend radius may require a larger optical test trench, so a small bend radius (e.g., 100-400 μm) is advantageous. Bend 405 may be more economical to fabricate, for example with a 3D printing process, than an angled surface, or have other advantages. Optical probe 402 may again have any composition with suitable refractive index, such as, but not limited to, an acrylic, or a siloxane.

In some embodiments, a probe with an out-of-plane edge coupler includes one or more optical lens. In an example further illustrated in FIG. 4, optical probe 401 includes a lens 415. Len 415 is depicted in dashed line as being optional, and may also be combined with bend 405. A plano-convex lens is illustrated, but lens 415 may have any shape suitable for collecting/emitting light over a larger half-cone angle than planar free end face 410. An optical probe may also have more than one lens (e.g., a stack of lenses) suitable for coupling light between waveguide plane $P_w$ and probe plane $P_p$.

Figure 5:
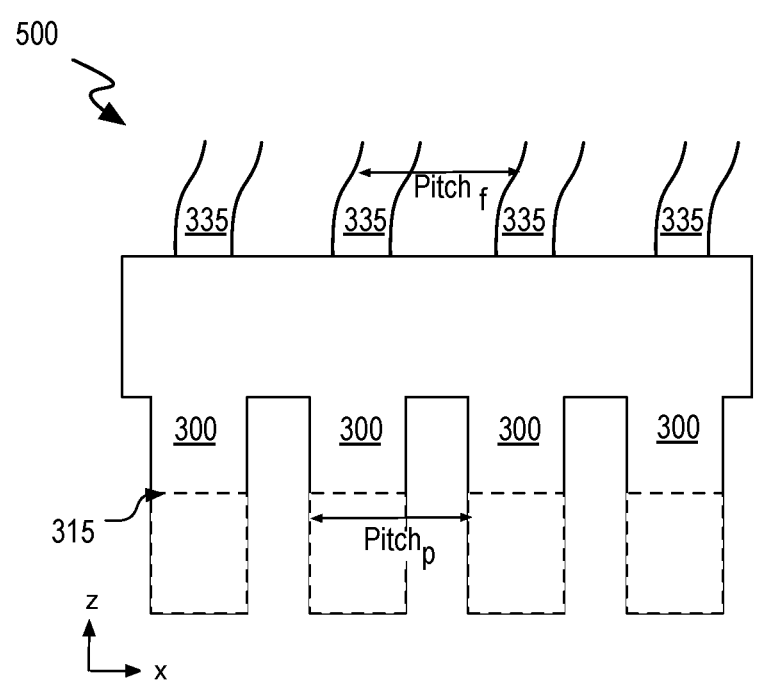
FIG. 5 is a cross-sectional view of an optical probe array for optical probing a plurality of edge coupled waveguides of a PIC, in accordance with some alternative embodiments.

Testing system 300 may include a plurality of end coupled out-of-plane optical probes. For example, any of the optical probe examples described above may be in an array to concurrently couple with a plurality of PIC photonic waveguides. FIG. 5 is a cross-sectional view of an optical probe array 500 for contactless optical probing of a plurality of edge coupled waveguides of a PIC, in accordance with some alternative embodiments. Although a four channel probe array is depicted in FIG. 5, a probe array may have any number of probes/channels. As shown, probe array 500 includes probes 300 spaced apart and aligned in a linear array. Each of probes 300 is optically coupled to a corresponding one of fibers 335. In this example, probes 300 again include angled surface 315 as an out-of-plane edge coupler. However, other probe designs that include alternative out-of-plane edge couplers may be similarly arrayed. Probe pitch may vary, for example to substantially match, or equal, a pitch of photonic waveguides of a PIC that are to be concurrently probed by probe array 500. Probe pitch may also be limited by the technique(s) employed to fabricate probe array 500. In some embodiments where probes 300 are 3D printed, probe pitch may range 127 µm (or less) to 250 µm (or more), for example. Probe array 500 is optically coupled to a fiber array comprising a plurality of optical fibers 335. Probe array 500 may include any optics (not depicted) to couple probes 300 at the probe pitch to the array of fibers 335 that may have another (e.g., larger) fiber pitch.

Figure 6:
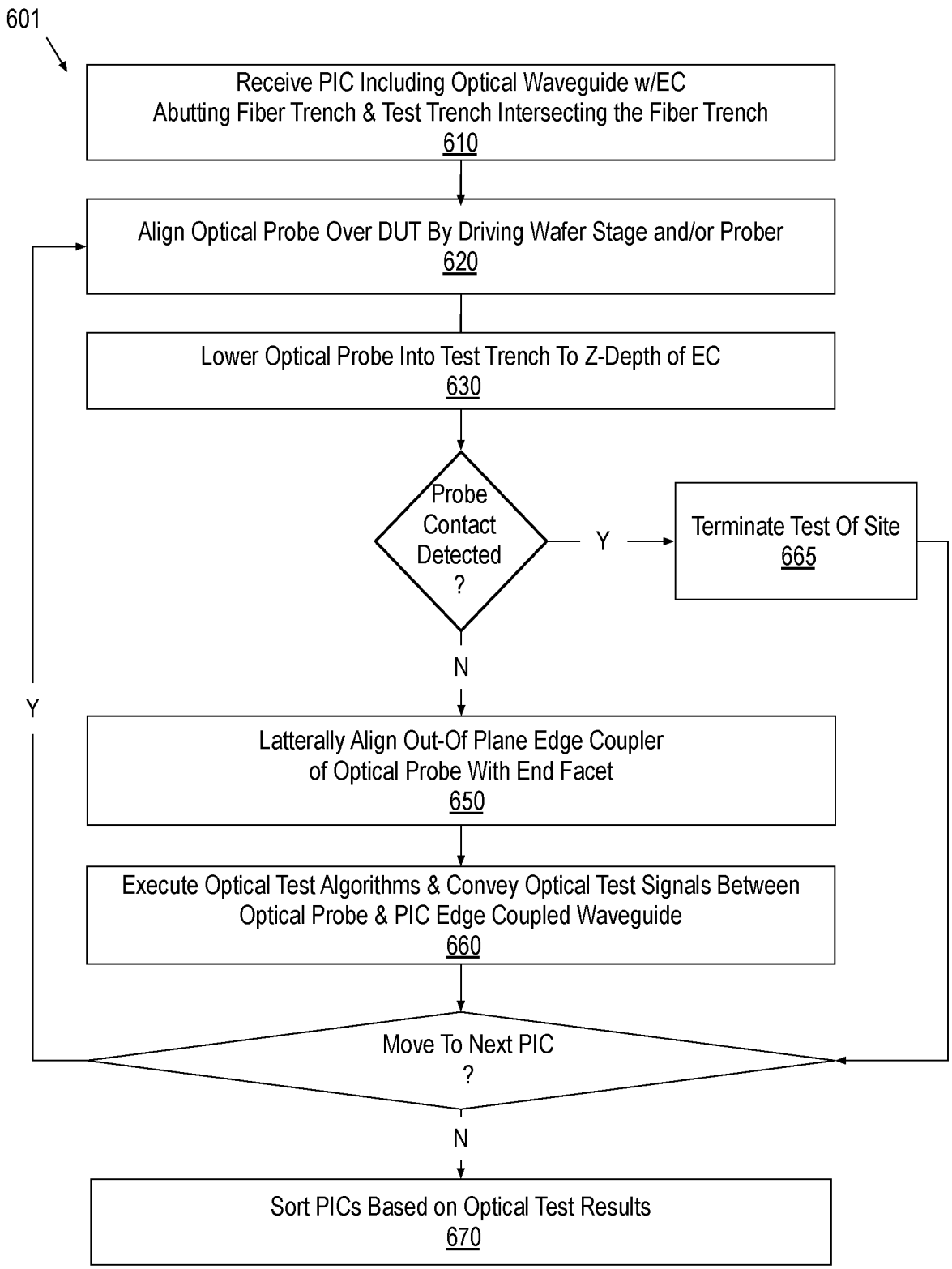
FIG. 6 is a flow diagram further illustrating methods of optical probing of edge coupled PICs, in accordance with some embodiments.

FIG. 6 is a flow diagram further illustrating methods 601 for contactless optical probing of an edge coupled PIC, in accordance with some embodiments. Methods 601 may be performed at block 195 of methods 101 (FIG. 1), for example. Methods 601 may be performed by testing system 300, for example. FIG. 7A-7E are cross-sectional views of PIC 200 in various states of contactless optical probing as methods 601 are practiced by testing system 300, in accordance with some embodiments.

Referring first to FIG. 6, methods 601 begin at block 110 where a PIC is received. In some advantageous embodiments, a wafer including multiple PIC is received at block 110. Each PIC includes both a photonic waveguide and an optical test trench. In some specific examples, the photonic waveguides terminate at an EC abutting a fiber trench, and the optical test trench intersects the fiber trench.

Methods 601 continue at block 620 where an optical probe is laterally aligned over a PIC DUT, for example by driving a prober to which the optical probe is mounted and/or driving a stage supporting the PIC wafer. The prober may, for example, translate over a prober plane that is substantially parallel with a plane of the PIC wafer (and photonic waveguides) to position one or more electrical probes attached to a probe card over electrical test points of a particular PIC DUT. Once aligned, the prober may be driven down, in a direction orthogonal with the PIC wafer plane until the electrical probes make contact with the electrical test points on the PIC DUT.

With the optical probe aligned over the PIC DUT, and electrical probes in contact with test points of the PIC DUT, methods 601 continue at block 630 where a free end of the optical probe is lowered into a test trench of the PIC DUT. In some embodiments of block 630, a multi-axis optical probe stage attached to the prober is translated within the prober plane to better align a free end of an optical probe with the optical test trench. In the example further illustrated in FIG. 7A, optical probe 300 is shown translating along the y-axis to be directly over test trench 130. In this example, probe 300 has a circular cross-section within the x-y plane, which has a diameter D that is smaller than test trench width W. In other embodiments, multi-axis optical probe stage attached to the prober is rotated about one or more axis to set an approach angle of the optical probe. In exemplary embodiments the approach angle is substantially perpendicular to waveguide plane $P_w$.

Figure 7A:
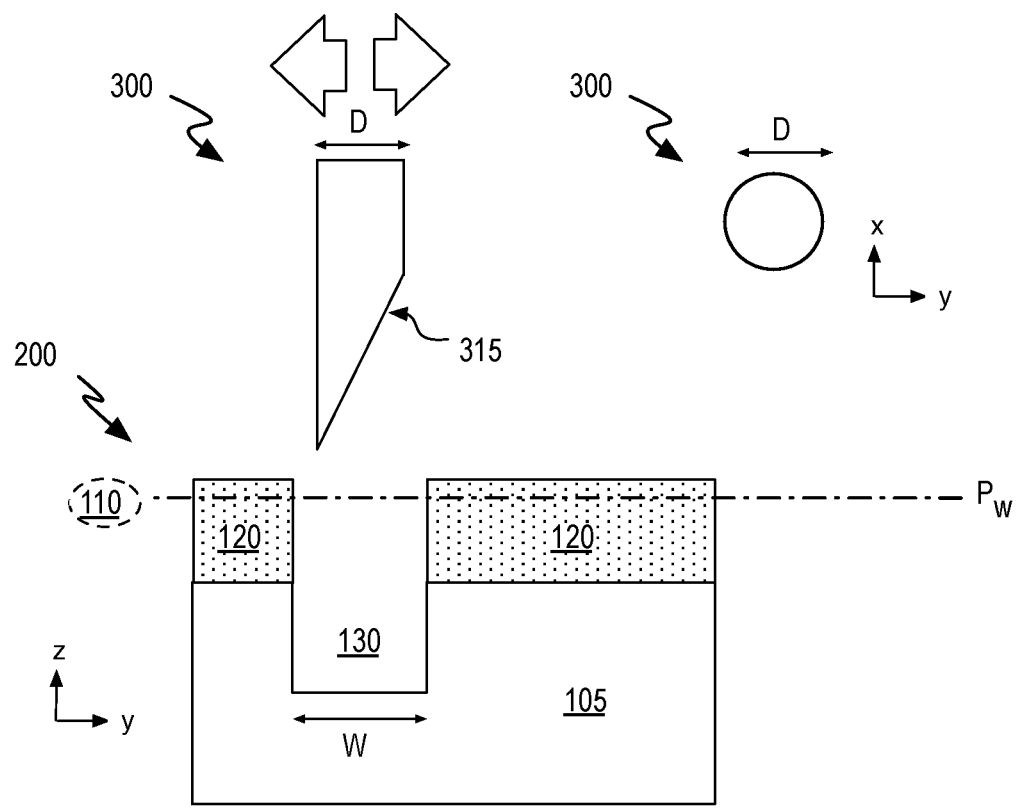
FIGS. 7A, 7B, 7C, 7D and 7E are cross-sectional views of an edge coupled PIC in various states of contactless optical probing, in accordance with some embodiments.
Figure 7B:
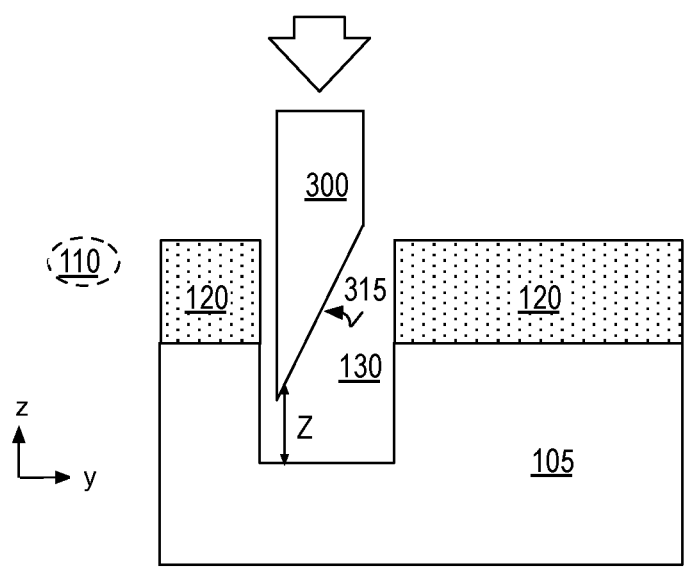

Lateral probe translation and/or approach angle rotation at block 630 may be performed as the optical probe stage is displaced out-of the plane of the prober (and of the PIC wafer) to position the free end of the optical probe at least partially within optical test trench where the out-of-plane edge coupler can interact with an edge-coupled waveguide of the PIC DUT. In the example further illustrated in FIG. 7B, probe 300 is lowered along the z-axis, coming to rest in the vertical direction when angled surface 315 is within the plane of photonic waveguide 110. In exemplary embodiments, the waveguide plane $P_w$ is substantially parallel to the PIC wafer plane and within 10-15 µm of the top surface of the PIC DUT, for example. As shown in FIG. 7B, probe 300 remains a distance Z above a bottom of test trench 130. Probe 300 also advantageously makes no physical contact with sidewalls of test trench 130. Probe 300 is therefore referred to here as being contactless.

As further illustrated in FIG. 6, during block 630 a contact sensor is sampling force or proximity between the optical probe and one or more surface of a test trench. If, for example, a force on the probe, increases during execution of block 630 to exceed a predetermined maximum force threshold, the probe may be deemed to be in physical contact with some portion of the PIC DUT (or in physical contact with some residue at least partially blocking the test trench). Alternatively, if distance of the probe and a surface of the test trench decreases during execution of block 630 to below a predetermined minimum distance threshold, the probe may be deemed to be in physical contact with some portion of the PIC DUT (or in sufficient danger of making physical contact with the PIC DUT or residue thereon).

If no contact force is detected during execution of block 630, methods 601 continue at block 650 where the probe is displaced and/or rotated about an azimuth angle within the waveguide plane $P_w$ while the free end of the optical probe is in the optical test trench. Lateral translation of the probe may allow the probe to traverse a length of the trench to align the optical probe with a particular waveguide edge coupler. For example, a probe may be positioned substantially where a fiber is to be subsequently located. Azimuth angle rotation of the optical probe may, for example, align an edge coupler at the free end of the probe to be substantially parallel with an end facet of a waveguide edge coupler. Probe contact may be sensed during the execution of block 650, for example substantially as described for block 650.

Any of the optical probe positioning performed at blocks 630 and 650 may be performed with optical probe feedback and/or PIC feedback. For example, parametric electrical tests dependent upon light reception by photonic waveguides may be performed on a PIC DUT while blocks 630 and/or 650 are executed with an optical probe that is emitting light through its out-of-plane edge coupler as a technique for actively aligning the optical probe based on a SNR metric. Similarly a PIC may be stimulated to emit light from a waveguide edge coupler that the optical probe is being aligned with, and an optical signal picked up by the probe during execution of blocks 630 and/or 650 may be employed to control probe positioning.

With the optical probe in final position, methods 601 continue at block 660 where a testing system executes optical testing algorithms on the PIC DUT. During the optical testing, optical test signals are conveyed between the optical probe and the PIC edge coupled waveguide(s). Any optical tests and/or signaling suitable for the PIC DUT may be performed at block 660 as embodiments herein are not limited in this respect. At block 660 electrical signals may be communicated with the PIC DUT through electrical test probes in contact with electrical test points on the PIC DUT. These electrical signals may be communicated while the optical probe is conveying optical signals with a waveguide of the PIC DUT, for example.

Figure 7C:
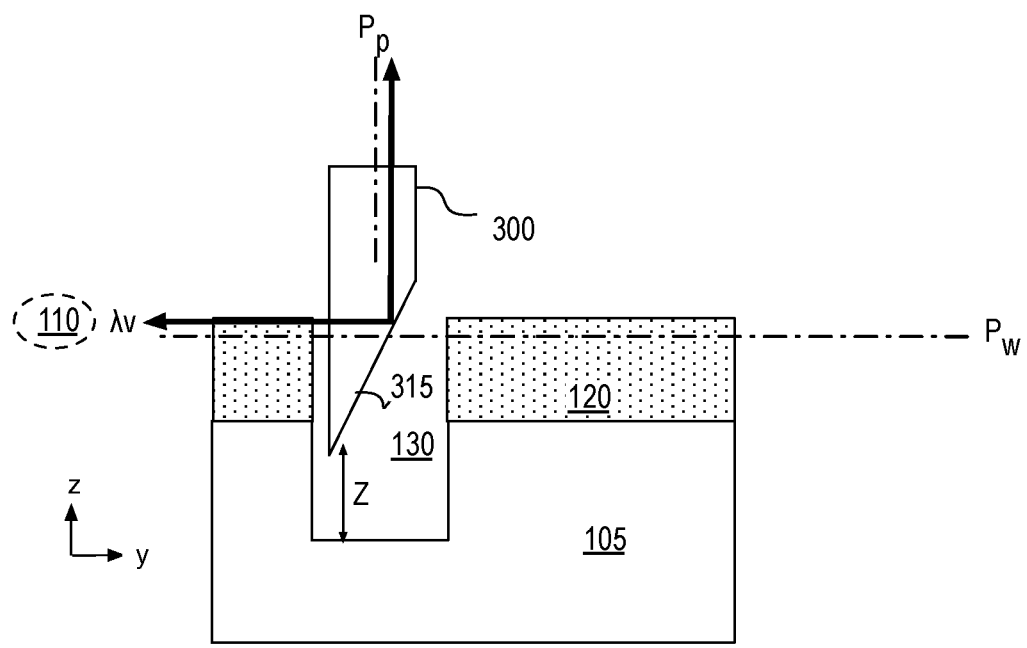

In the example further illustrated in FIG. 7C, optical test signal light λv is directed into/out of optical probe plane $P_p$ and out of/into waveguide plane $P_w$ by the out-of-plane edge coupler at the free end of probe 300. As depicted for this example, test signal light λv traverses free space between an EC of waveguide 110 and probe 300. Angled probe surface 315 has an angle relative to both probe plane $P_p$ and waveguide plane $P_w$ that functions as a mirror between probe plane $P_p$ and waveguide plane $P_w$. Efficiency of the mirror is dependent on the index contrast between free space (air) and the composition of probe 300. In some advantageous embodiments, angle probe surface 315 achieves substantially total internal reflection (TIR).

Figure 7D:
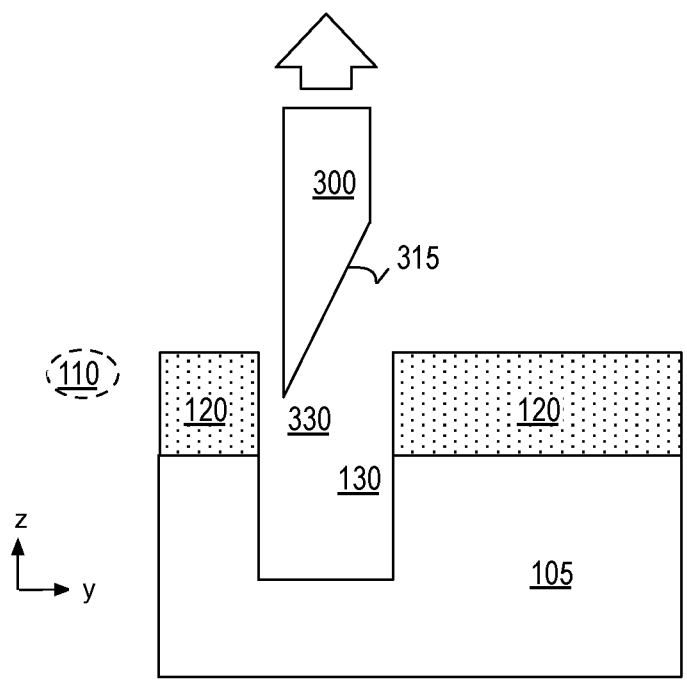

Following the optical testing, probe 300 may be withdrawn from test trench 130, as depicted in FIG. 7D. Methods 601 (FIG. 6) may then continue with a subsequent iteration by returning to block 620 where the prober is moved to another region of the wafer. If another PIC is not to be tested, methods 601 end at block 670 where PICs of a wafer are sorted and/or classified according to testing parametrics determined at least in part based on the optical test algorithms executed at block 660. Any subsequent dicing and/or packaging of the PICs may be further based upon testing parametrics determined at least in part based on the optical test algorithms executed at block 660.

Figure 7E:
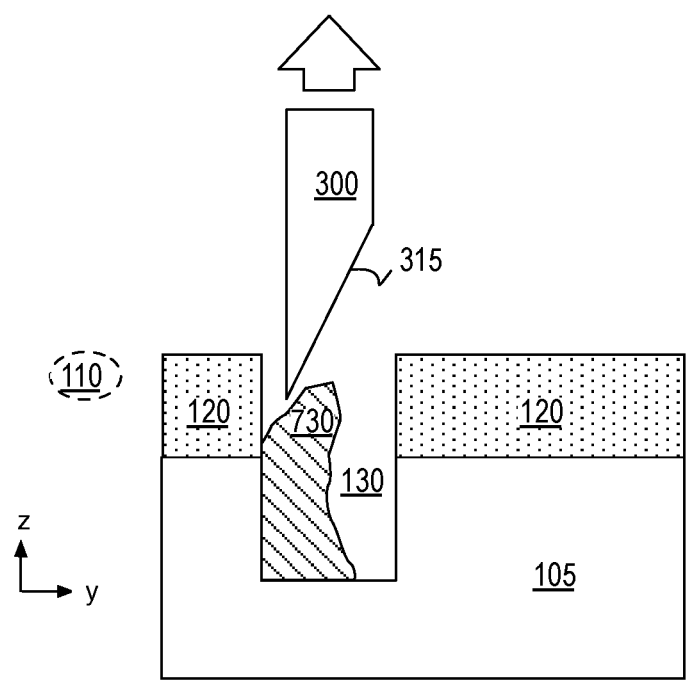

If optical probe to PIC contact is detected during execution of block 630 (or block 650), optical testing of the test trench site is terminated at block 665. As shown in FIG. 7E, for example, probe 300 is withdrawn from test trench 130 in response to detecting contact between probe 300 and a residue 730 that is blocking at least a portion of test trench 130. Returning to FIG. 6, after terminating the optical test for the PIC DUT, methods 601 may then continue with moving the prober to a next PIC, or tabulating all PIC parametric data for a given PIC wafer.

Figure 8A:
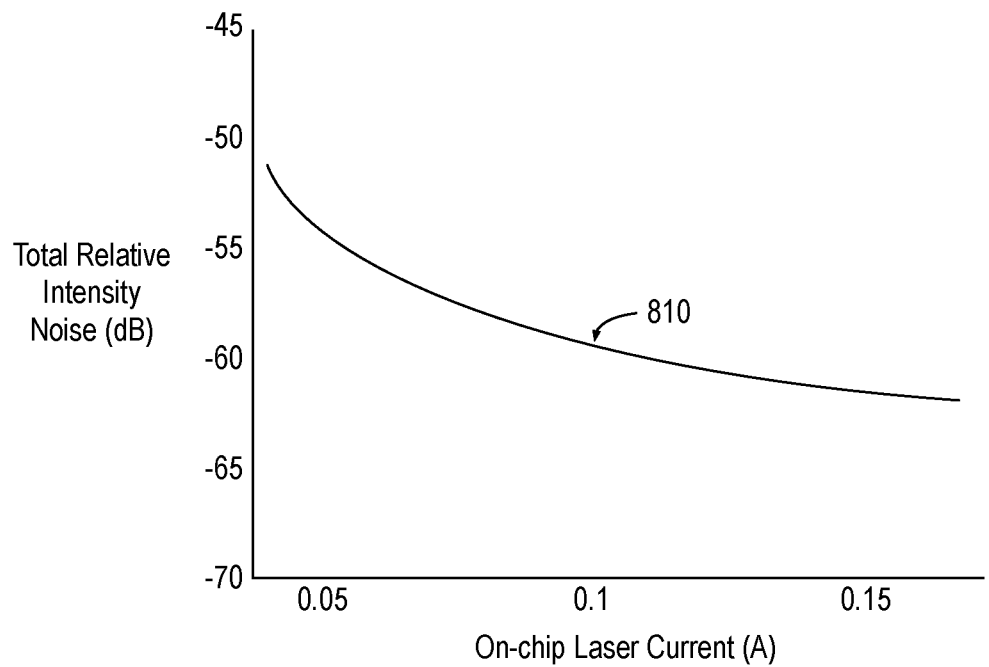
FIGS. 8A and 8B are graphs illustrating optical coupling loss associated with contactless probing of edge coupled PICs, in accordance with some embodiments.
Figure 8B:
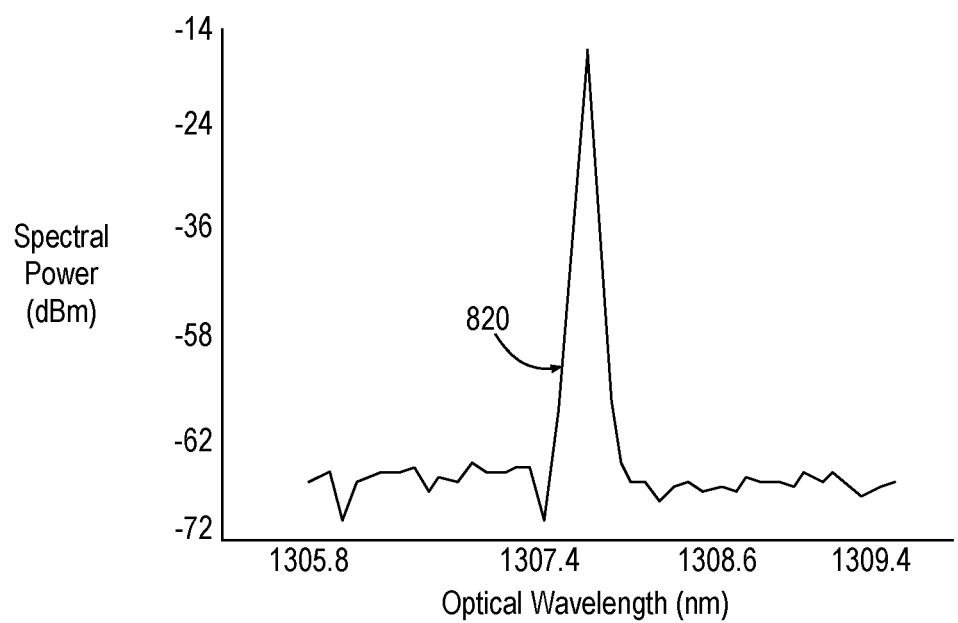

FIGS. 8A and 8B are graphs illustrating optical coupling loss associated with contactless probing of edge coupled PIC s, in accordance with some embodiments. FIG. 8A illustrates a graph 810 indicative of measurements of total relative intensity noise (RIN) collected as a function of on-chip PIC laser current. The measurements of RIN were collected with an optical testing system in accordance with embodiments that included an out-of-plane edge coupled probe positioned within a test trench of a PIC, for example substantially as described above. As shown, the values of RIN indicate coupling loss associated with the optical probe is sufficiently low to achieve adequate optical test sensitivity for most PIC applications. FIG. 8B illustrates a graph 820 indicative of measurements of spectral power collected from an on-chip PIC laser as a function of wavelength. This side mode suppression ratio (SMSR) data was again collected with an optical testing system in accordance with embodiments that included an out-of-plane edge coupled probe that was positioned within a test trench of a PIC, for example substantially as described above. The strong peak in the SMSR data also shows adequate optical test sensitivity for most PIC applications.

Figure 9:
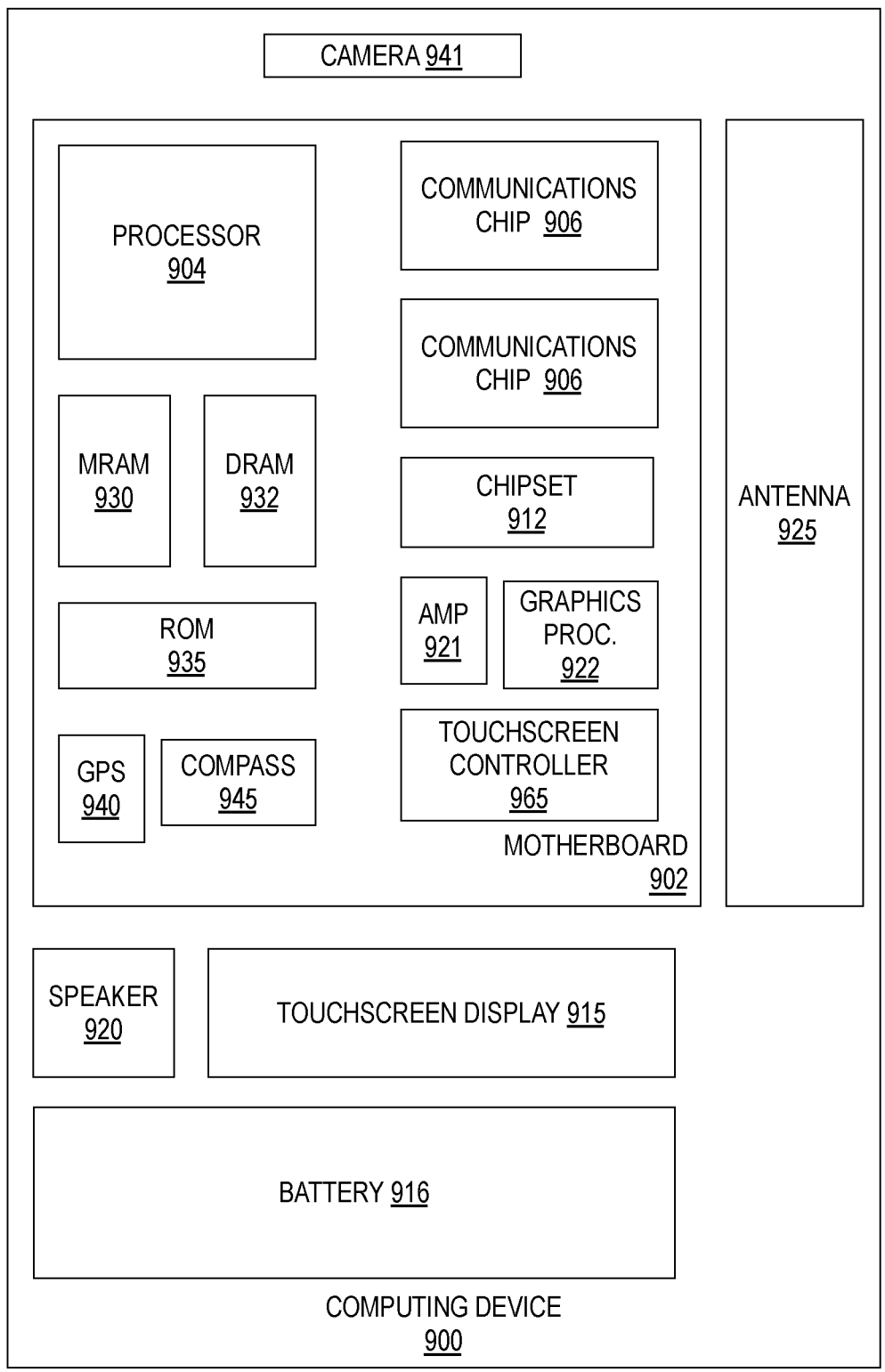
FIG. 9 is a functional block diagram of an electronic computing device, in accordance with some embodiments.

FIG. 9 is a functional block diagram of an electronic computing device 900, in accordance with some embodiments. Device 900 may be included within tester 305 (FIG. 3), and execute test program 306, for example during any of blocks 630, 650 or 660 (FIG. 6). Device 900 further includes a motherboard 902 hosting a number of components, such as, but not limited to, a processor 904 (e.g., an applications processor). Processor 904 may be physically and/or electrically coupled to motherboard 901. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902. These other components include, but are not limited to, volatile memory (e.g., DRAM 932), non-volatile memory (e.g., ROM 935), flash memory (e.g., NAND or NOR), magnetic memory (MRAM 930), a graphics processor 922, a digital signal processor, a crypto processor, a chipset 912, an antenna 925, touchscreen display 915, touchscreen controller 965, battery 916, audio codec, video codec, power amplifier 921, global positioning system (GPS) device 940, compass 945, accelerometer, gyroscope, speaker 920, camera 941, and mass storage device (such as hard disk drive, solid-state drive (SSD), compact disk (CD), digital versatile disk (DVD), and so forth, or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including, but not limited to, those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 10:
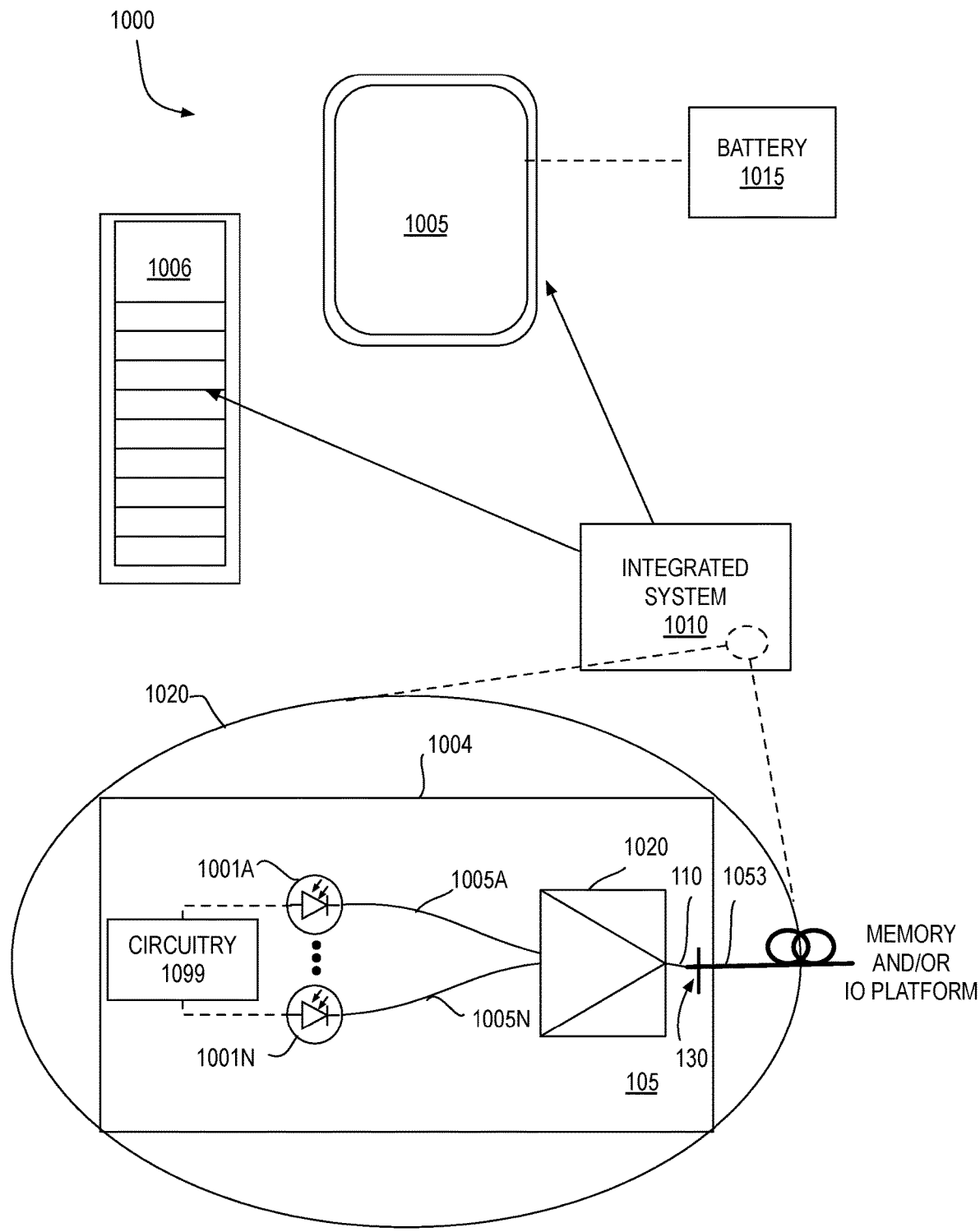
FIG. 10 illustrates a mobile computing platform and a data server machine employing an optical receiver module including a PIC having an WDM receiver, in accordance with an embodiment.

FIG. 10 illustrates a mobile computing platform 1005 and a data server machine 1006 employing an optical receiver module including a PIC 1004 having a WDM receiver, in accordance with an embodiment. PIC 1004 includes optical test trench 130, for example substantially as described elsewhere herein. Although PIC 1004 illustrates an exemplary optical receiver, an optical transmitter or transceiver may similarly include test trench 130 at a waveguide-fiber-interface.

Server machine 1006 may be any commercial server, for example including any number of high performance computing platforms disposed within a rack and networked together for electronic data processing, which in the exemplary embodiment includes integrated system 1010. Mobile computing platform 1005 may be any portable device configured for each of electronic data display, electronic data processing, wireless electronic data transmission, or the like. For example, mobile computing platform 1005 may be any of a tablet, a smart phone, laptop computer, etc., and may include a display screen (e.g., a capacitive, inductive, resistive, touchscreen), a chip-level or package-level integrated system 1010, and a battery 1015.

Whether disposed within integrated system 1010, further illustrated in expanded view 1020, or as a stand-alone packaged chip, packaged monolithic PIC 1004 includes an optical test trench 130, for example substantially as described elsewhere herein. Optical fiber 1053 inputs a signal optical beam into a monolithically integrated optical waveguide 110, for example by an edge coupling waveguide-to-fiber interface. As shown, optical fiber 1053 extends across test trench 130 and is coupled to a waveguide EC that was previously tested by an optical probe within test trench 130, for example as described elsewhere herein.

Selected wavelengths of signal light are separated with an optical de-multiplexer 1020 to output to a plurality of output optical waveguides 1005A-1005N also disposed on substrate 105. Output optical waveguides 1005A-1005N are each further coupled into a low voltage photodetectors 1001A-1001N, each of which includes an MSM or p-i-n photodiode structure, for example. Photodetectors 1001A-1001N are in turn electrically coupled to downstream integrated circuitry 1099, which may for example further include a voltage supply and sense circuitry. In certain embodiments, voltage supply and sense circuitry is implemented with CMOS transistors also on substrate 105.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It will be recognized that the embodiments described can be practiced with modification and alteration without departing from the scope of the appended claims. For example the above embodiments may include specific combinations of features as further provided below.

In first examples, a photonic integrated circuit (PIC) comprises a photonic waveguide over a substrate material. A terminus of the waveguide comprises a PIC-to-fiber edge coupler (EC). The PIC comprises a first trench within the substrate material. A terminus of the first trench abuts the EC. The PIC comprises a second trench bifurcating a length of the first trench between the EC and a fiber land where a fiber is to be mounted to the PIC.

In second examples, for any of the first examples the EC comprises an end facet. The second trench is laterally spaced apart from the end facet by no more than 500 μm.

In third examples, for any of the first through second examples the first trench has a first width and a first depth to accept an optical fiber having a cladding diameter less than 200 μm. The second trench has a second width and a second depth to accept an optical probe, wherein at least the second width is different than the first width, or the second depth is different than the first depth.

In fourth examples, for any of the first through fourth examples the first trench has a v-groove profile, the first width is less than 200 μm, and the second width is greater than 300 μm.

In fifth examples, for any of the first through fourth examples, the photonic waveguide is one of a plurality of photonic waveguides, each comprising a PIC-to-fiber edge coupler (EC). The first trench is one of a plurality of first trenches that intersect the fiber land. A terminus of each of the first trenches abuts a corresponding one of the plurality of waveguides. The second trench bifurcates each of the first trenches between the EC of the each of the waveguides and the fiber land.

In sixth examples, for any of the first through fifth examples the first trenches have a pitch of no more than 250 μm.

In seventh examples, for any of the first through sixth examples the PIC further comprises an optical fiber within the first trench. A length of the optical fiber spans the second trench.

In eighth examples, a photonic integrated circuit (PIC) testing apparatus comprises a prober to be positioned relative to a plane of a PIC device under test (DUT). The testing apparatus comprises an optical probe. A base of the optical probe is attached to the prober, and an out-of-plane edge coupler (EC) is proximal to a free end of the optical probe.

In ninth examples, for any of the eighth exmaples the out-of-plane EC comprises a mirror or lens to redirect light between a first propagation within the optical probe and a second propagation within the plane of the PIC DUT.

In tenth examples, for any of the eighth through ninth examples the optical probe comprises an unclad material, and the out-of-plane EC comprises an angled surface of the material at the free end, the angled surface non-normal to a longitudinal axis of the clad fiber.

In eleventh examples, for any of the eighth through tenth examples the optical probe extends out of a plane of the prober to intersect the plane of a PIC DUT when the plane of the prober is substantially parallel the plane of the PIC DUT, and the out-of-plane EC is to couple light propagating within a free space gap between the free end of the optical probe and a PIC-to-fiber EC of a photonic waveguide in the PIC DUT.

In twelfth examples, for any of the eighth through eleventh examples the test apparatus comprises a motorized stage physically connecting the optical probe to the prober. The stage is displaceable relative to the prober along multiple axes.

In thirteenth examples, for any of the twelfth examples the stage is displaceable along an axis perpendicular to the plane of the prober to position the out-of-plane EC into a trench within a PIC DUT.

In fourteenth examples, for any of the eighth through thirteenth examples the testing apparatus comprises a sensor to detect contact between the free end of the optical probe and a surface of a PIC DUT.

In fifteenth examples, for any of the fourteenth examples the platform is to withdraw the optical probe from the trench in response to a signal from the sensor indicative of contact.

In sixteenth examples, for any of the eighth through fifteenth examples the testing apparatus comprises an electrical probe card, the electrical probe card comprising a plurality of electrical test probes to contact a plurality of electrical test points on the PIC DUT, and to communicate electrical signals with the DUT while the optical EC is within the plane of the PIC-to-fiber EC.

In seventeenth examples, a method of testing a photonic integrated circuit (PIC) comprises positioning a prober relative to a PIC device under test (DUT). The prober comprises an optical probe, and the optical probe comprises an out-of-plane edge coupler (EC) proximal to a free end of the optical probe. The method comprises positioning the free end of the optical probe within a test trench in the PIC DUT to a depth that aligns the out-of-plane EC with an EC of a photonic waveguide of the PIC DUT. The method comprises conveying optical signals between the optical probe and the photonic waveguide.

In eighteenth examples, for any of the seventeenth examples the photonic waveguide comprises a PIC-to-fiber EC. The trench bifurcates a length of a fiber trench that abuts the PIC-to-fiber EC.

In nineteenth examples, for any of the seventeenth through eighteenth examples the method comprises contacting a plurality of electrical test points on the PIC DUT with electrical probes coupled to the prober, and conveying electrical signals between the PIC DUT and the electrical probes while the optical EC of the probe is optically coupled to the photonic waveguide through the out-of-plane optical edge coupler (EC).

In twentieth examples, for any of the seventeenth through nineteenth examples the method comprises detecting physical contact between the free end of the probe and a surface of the PIC DUT, and retracting the free end of the optical probe away from the trench in response to detecting the contact.

In twenty-first examples, for any of the seventeenth through twentieth examples the PIC DUT is one of a plurality of PICs within a contiguous wafer. Positioning the prober comprises laterally displacing the prober to be over individual ones of the plurality of PICs. Positioning the free end of the optical probe within the test trench comprises vertically displacing the free end of the optical probe relative to a photonic waveguide of the individual ones of the plurality of PICs.

However, the above embodiments are not limited to the specific examples provided herein and, in various implementations, the above embodiments may include the practice of only a subset of such features, the practice a different order of such features, the practice of a different combination of such features, and/or the practice of features in addition to those features explicitly listed. The scope of the disclosure should, therefore, be determined with reference to the appended claims, along with the full scope of equivalents to which such claims are entitled.

What is claimed is:

1. A photonic integrated circuit (PIC), comprising:
   a photonic waveguide over a substrate material, wherein a terminus of the waveguide comprises a PIC-to-fiber edge coupler (EC);
   a first trench within the substrate material, wherein a terminus of the first trench abuts the EC; and
   a second trench bifurcating the first trench into trench lengths that are on opposite sides of the second trench and between the EC and a fiber land where a fiber is to be mounted to the PIC.

2. The PIC of claim 1, wherein:
   the EC comprises an end facet; and
   the second trench is laterally spaced apart from the end facet by one of the trench lengths, which is no more than 500 µm.

3. The PIC of claim 1, wherein:
   the first trench has a first width and a first depth to accept an optical fiber having a cladding diameter less than 200 µm;
   the second trench has a second width and a second depth to accept an optical probe, wherein at least the second width is different than the first width, or the second depth is different than the first depth.

4. The PIC of claim 3, wherein:
   the first trench has a profile comprising a v-groove; and
   the first width is less than 200 µm, and the second width is greater than 300 µm.

5. The PIC of claim 1, wherein:
   the photonic waveguide is one of a plurality of photonic waveguides, each comprising a PIC-to-fiber edge coupler (EC);
   the first trench is one of a plurality of first trenches that intersect the fiber land, wherein a terminus of each of the first trenches abuts a corresponding one of the plurality of waveguides; and
   the second trench bifurcates each of the first trenches into trench lengths on opposite sides of the second trench and between the EC of the each of the waveguides and the fiber land.

6. The PIC of claim 5, wherein the first trenches have a pitch of no more than 250 µm.

7. The PIC of claim 1, further comprising an optical fiber within the first trench, wherein a length of the optical fiber spans the second trench.

8. A photonic integrated circuit (PIC) testing apparatus, comprising:
   a prober to be positioned relative to a plane of a PIC device under test (DUT); and
   an optical probe, wherein:
      a base of the optical probe is attached to the prober; and
      an out-of-plane edge coupler (EC) is proximal to a free end of the optical probe, wherein the out-of-plane EC comprises a mirror or lens to redirect light between a first propagation within the optical probe and a second propagation within the plane of the PIC DUT.

9. The PIC testing apparatus of claim 8, wherein the optical probe comprises an unclad material, and the out-of-plane EC comprises an angled surface of the material at the free end, the angled surface non-normal to a longitudinal axis of a clad fiber.

10. The PIC testing apparatus of claim 8, further comprising:
    a motorized stage physically connecting the optical probe to the prober, wherein the stage is displaceable relative to the prober along multiple axes.

11. The PIC testing apparatus of claim 10, wherein the stage is displaceable along an axis perpendicular to the plane of the prober to position the out-of-plane EC into a trench within a PIC DUT.

12. The PIC testing apparatus of claim 11, further comprising a sensor to detect contact between the free end of the optical probe and a surface of a PIC DUT.

13. The PIC testing apparatus of claim 12, wherein the prober is to withdraw the optical probe from the trench in response to a signal from the sensor indicative of contact.

14. The PIC testing apparatus of claim 8, further comprising an electrical probe card, the electrical probe card comprising a plurality of electrical test probes to contact a plurality of electrical test points on the PIC DUT, and to communicate electrical signals with the DUT while the out-of-plane EC is within a plane of a PIC-to-fiber EC of a photonic waveguide in the PIC DUT.

15. A photonic integrated circuit (PIC) testing apparatus, comprising:
    a prober to be positioned relative to a plane of a PIC device under test (DUT); and
    an optical probe, wherein:
       a base of the optical probe is attached to the prober;
       an out-of-plane edge coupler (EC) is proximal to a free end of the optical probe;
       the optical probe extends out of a plane of the prober to intersect the plane of a PIC DUT when the plane of the prober is substantially parallel the plane of the PIC DUT; and
       the out-of-plane EC is to couple light propagating within a free space gap between the free end of the optical probe and a PIC-to-fiber EC of a photonic waveguide in the PIC DUT.

16. A method of testing a photonic integrated circuit (PIC), the method comprising:
    positioning a prober relative to a PIC device under test (DUT), wherein the prober comprises an optical probe, and the optical probe comprises an out-of-plane edge coupler (EC) proximal to a free end of the optical probe, wherein the out-of-plane EC comprises a mirror or lens to redirect light between a first propagation within the optical probe and a second propagation within a plane of the PIC DUT;

positioning the free end of the optical probe within a trench in the PIC DUT to a depth that aligns the out-of-plane EC with a photonic waveguide of the PIC DUT comprising a PIC-to-fiber EC; and conveying optical signals between the optical probe and the photonic waveguide.

17. The method of claim 16, wherein
the trench bifurcates a fiber trench that abuts the PIC-to-fiber EC into a first fiber trench length on a first side of the trench and a second fiber trench length on a second, opposite, side of the trench.

18. The method of claim 16, further comprising:
contacting a plurality of electrical test points on the PIC DUT with electrical probes coupled to the prober; and conveying electrical signals between the PIC DUT and the electrical probes while the optical EC of the probe is optically coupled to the photonic waveguide through the out-of-plane EC.

19. The method of claim 16, further comprising:

detecting physical contact between the free end of the probe and a surface of the PIC DUT; and retracting the free end of the optical probe away from the trench in response to detecting the contact.

20. The method of claim 16, wherein:

the PIC DUT is one of a plurality of PICs within a contiguous wafer;

positioning the prober comprises laterally displacing the prober to be over individual ones of the plurality of PICs; and positioning the free end of the optical probe within the test trench comprises vertically displacing the free end of the optical probe relative to a photonic waveguide of the individual ones of the plurality of PICs.

* * * * *